United States Patent
Kohla

(10) Patent No.: US 7,701,223 B2
(45) Date of Patent: Apr. 20, 2010

(54) METHOD FOR CONTACT-FREE TESTING OF ANTENNAS APPLIED TO A MATERIAL WEB

(75) Inventor: Michael Kohla, Havixbeck (DE)

(73) Assignee: Nordenia Deutschland Gronau GmbH, Gronau (DE)

( * ) Notice: Subject to any disclaimer, the term of this patent is extended or adjusted under 35 U.S.C. 154(b) by 204 days.

(21) Appl. No.: 11/895,647

(22) Filed: Aug. 24, 2007

(65) Prior Publication Data

US 2008/0048670 A1 Feb. 28, 2008

(30) Foreign Application Priority Data

Aug. 26, 2006 (DE) ........................ 10 2006 040 180

(51) Int. Cl.
  *G01R 31/02* (2006.01)
  *G08B 13/14* (2006.01)
  *H04M 1/00* (2006.01)
(52) U.S. Cl. ................. 324/537; 340/572.7; 340/572.1; 455/562.1
(58) Field of Classification Search ................. 324/537; 340/572.7
  See application file for complete search history.

(56) References Cited

U.S. PATENT DOCUMENTS

| 5,543,779 | A | * | 8/1996 | Aspesi et al. | .......... | 340/539.26 |
| 6,104,291 | A | | 8/2000 | Beauvillier et al. | | |
| 6,147,662 | A | | 11/2000 | Grabau et al. | | |
| 6,487,681 | B1 | | 11/2002 | Tuttle et al. | | |
| 2003/0062907 | A1 | * | 4/2003 | Nevermann | .................. | 324/637 |
| 2004/0160233 | A1 | | 8/2004 | Forster | | |
| 2005/0108597 | A1 | * | 5/2005 | Iwami et al. | .................. | 714/48 |
| 2005/0243012 | A1 | * | 11/2005 | Ryou et al. | .................. | 343/895 |
| 2006/0038687 | A1 | * | 2/2006 | White et al. | ............. | 340/572.8 |

FOREIGN PATENT DOCUMENTS

| DE | 10117249 | * | 7/2002 |
| EP | 1522956 A1 | | 4/2005 |
| WO | WO 01/82213 | | 11/2001 |

OTHER PUBLICATIONS

Ritamaki et al., "Contactless radiation pattern measurement method for UHF RFID transponders," Electronics Letters, Jun. 2005, vol. 41, No. 13.

* cited by examiner

*Primary Examiner*—Jeff Natalini
(74) *Attorney, Agent, or Firm*—Collard & Roe, P.C.

(57) ABSTRACT

A method for contact-free testing of antennas applied to a material web, wherein the material web having the antennas is passed to a measurement device. The antennas are passed past an assigned measurement antenna arrangement of the measurement device in the region of the measurement device and the measurement antenna arrangement has a high-frequency signal $S_{mess}$ of a transmitter applied to it. This signal is correlated with a pre-determined working frequency $f_A$ of the antennas. The high-frequency signal $S_{rück}$ that returns from the measurement antenna arrangement is determined and compared with default values, and the adherence to production tolerances is determined by the comparison of the returning high-frequency signal $S_{rück}$ with the default values for each of the individual antennas.

6 Claims, 3 Drawing Sheets

METHOD FOR CONTACT-FREE TESTING OF ANTENNAS APPLIED TO A MATERIAL WEB

BACKGROUND OF THE INVENTION

1. Field of the Invention

The invention relates to a method for contact-free testing of antennas for RFID labels applied to a material web. RFID labels have not only an antenna but also an RFID chip as an active or passive circuit, and are suitable, for example, for identifying objects of all kinds, such as goods and transport packagings. In the identification of the packaging of mass-produced articles, in particular, only one-time use of an RFID label is generally provided, so that production costs are particularly low.

2. The Prior Art

U.S. Pat. No. 6,147,662 describes a method for the production of RFID labels, wherein an antenna is imprinted onto a material web with conductive ink or with conductive toner, and wherein subsequently, an RFID chip is set onto the antenna and contacted with it. The RFID labels are passed to a measurement device before being wound up into a roll, with defective RFID labels being determined and marked. In the case of RFID labels that are operated at a frequency in the UHF range (300 MHz to 3000 MHZ), in particular, a high level of rejects must be expected because the structures are usually fine. The production costs are greatly increased by a high level of rejects, since the entire RFID labels, with their antenna and RFID chip, must be sorted out and disposed of.

SUMMARY OF THE INVENTION

With this background, it is an object of the invention to reduce the costs of the production of RFID labels.

This object is accomplished, according to the invention, by means of a method for contact-free testing of antennas for RFID chips applied to a material web, wherein the material web having a plurality of antennas, which each have at least one conductive track and non-contacted connector ends, is passed to a measurement device. The antennas are each passed past an assigned measurement antenna arrangement of the measurement device in the region of the measurement device. The measurement antenna arrangement has a high-frequency signal $S_{mess}$ of a transmitter applied to it, which signal is correlated with a pre-determined working frequency $f_A$ of the antenna. The high-frequency signal $S_{rück}$ that returns from the measurement antenna arrangement is determined and compared with default values, and the adherence to production tolerances is determined by means of the comparison of the returning high-frequency signal $S_{rück}$ with the default values for the individual antennas, in each instance. According to the invention, checking of the antennas takes place before these are contacted with an RFID chip, and defective antennas, which must be sorted out, are not provided with an RFID chip. Furthermore, an increase in the reject rate can be detected directly, even during the production of antennas for RFID labels, and the production process can then be adjusted or interrupted.

The method according to the invention is particularly suitable for antennas whose working frequency lies in the UHF range, since in the case of these antennas, an increased level of rejects must be expected, because of the fine structures. This is particularly the case for mass production using a printing method, for example an intaglio printing method.

According to the invention, the measurement antenna arrangement of the measurement device has a high-frequency signal of the transmitter applied to it, and part of the high-frequency power is emitted by the measurement antenna arrangement and absorbed by the antenna to be tested. In this connection, it is practical to select the frequency $f_{mess}$ of the transmitter in such a manner that the antennas to be tested, which lie within pre-determined production tolerances, absorb a maximum of the high-frequency power, thereby also minimizing the high-frequency signal $S_{rück}$ that returns to the connector of the measurement antenna arrangement. In order to determine the power that is assigned to the outgoing high-frequency signal $S_{mess}$, and the power assigned to the returning high-frequency signal $S_{rück}$, the high-frequency signal $S_{mess}$ is preferably passed from the transmitter to the measurement antenna arrangement by way of a directional coupler that emits a first measurement signal that is proportional to the high-frequency power $P_{vor}$, which runs to the measurement antenna arrangement. The directional coupler emits a second measurement signal that is proportional to the high-frequency power $P_{rück}$, which is reflected by the measurement antenna arrangement. In practice, the ratio of the power fed in at the transmitter to the power reflected back by the measurement arrangement is also indicated in decibels (dB), as the front-to-back ratio.

The method according to the invention is fundamentally applicable to any desired antenna structures. It is practical if the measurement antenna arrangement is adapted, in terms of its geometry, to the antennas to be tested. The method according to the invention is particularly suitable for testing antennas that are formed as dipole antennas, of two conductive tracks, each having one connector end. Proceeding from the central connector ends, the conductive tracks, which have approximately the same length, extend away from one another. In this connection, the working frequency $f_A$ of the antenna is determined by means of its total length, which corresponds to approximately half the wavelength. For testing these dipole antennas, a separate measurement antenna of the measurement antenna arrangement is preferably provided for each of the conductive tracks, and the measurement antenna arrangement has a high-frequency signal $S_{mess}$ applied to it, the frequency $f_{mess}$ of which approximately corresponds to twice the working frequency $f_A$. In this connection, the frequency $f_{mess}$ approximately corresponds to twice the resonance frequency that is to be expected for the individual conductive tracks, in each instance. If the conductive track does not have any defects, for example in the form of interruptions, a maximum of energy is withdrawn from the measurement antenna due to the resonance, and therefore the high-frequency signal $S_{rück}$ that returns from the measurement antenna on the connector line is also reduced. In the case of a defective conductive track, there is no resonance present at the frequency $f_{mess}$, so that the proportion of the returning high-frequency power $P_{rück}$ is comparatively great. In this connection, the adherence to manufacturer tolerances can be determined for each individual antenna, from the front-to-back ratio, by determining the returning high-frequency signal $S_{rück}$, for example by means of a directional coupler and by means of a subsequent amplifier/evaluation logic. In order to determine possible short-circuits in the region of the connector ends, the pre-determined working frequency $f_A$ is applied to the measurement antenna arrangement according to the same measurement principle. In the case of a short-circuit, there is a great increase in the reflected high-frequency power, as compared with an antenna that is capable of functioning.

If the antenna has only one conductive track, which can be formed into a conductor loop, for example, the antenna usually has one measurement antenna of the measurement antenna arrangement assigned to it, to which a high-frequency signal $S_{mess}$ is applied, the frequency $f_{mess}$ of which approximately corresponds to the working frequency $f_A$ to be expected. As described above, in the case of a defective antenna, in comparison with an antenna that is capable of functioning, a great increase in the returning power is observed.

Due to the contact-free testing of the antennas, a very great through-put can be achieved. Thus, in a preferred embodiment of the invention, the material web is passed past the measurement device at an average web speed of more than 0.8 m/s, preferably more than 1.6 m/s. In this connection, the individual antennas can be passed past the measurement antenna arrangement of the measurement device at a constant web speed, or at a web speed that is modulated by means of a register roller arrangement, for example, without any restrictions.

In a preferred embodiment of the method according to the invention, at least 50, preferably at least 100 measurement values of the returning high-frequency signal $S_{rück}$ are determined for each of the antennas, and subsequently averaged. In addition or alternatively, however, it is also possible to smooth and/or average the signal directly, by means of a corresponding configuration of the electrical measurement circuit, for example by means of filters.

The antennas found to be defective can be directly removed from the material web, within the framework of the invention, or, for example, can be marked by an imprint or a punching. Furthermore, it is also possible to store the position of defective antennas on the material web electronically, in the memory of a control. Subsequently, only antennas capable of functioning are subsequently provided with an RFID chip, on the basis of this information.

Before the contact-free testing takes place, the antennas are imprinted onto the material web, preferably using a printing process, for example an intaglio printing process, using conductive ink. Possible web material is, in particular, polymer film material, preferably from the group of the polyesters, polyamides, and polyolefins. The material web typically has a layer thickness between 30 and 150 μm.

In particular, in order to allow cost-advantageous production of the antennas for RFID labels, the material web preferably has at least two rows of antennas crosswise to its running direction, with at least one measurement antenna arrangement of the measurement device provided for each row. In order to prevent mutual interference of the measurement antenna arrangements with regard to one another, these are disposed offset relative to one another in the running direction of the material web. In this connection, it is practical if the distance between two adjacent measurement antenna devices is at least half the wavelength of the antennas. In order to achieved the greatest possible accuracy with the method according to the invention, the gap between the conductive tracks of the antennas and the measurement antennas must be kept as constant as possible.

BRIEF DESCRIPTION OF THE DRAWINGS

Other objects and features of the present invention will become apparent from the following detailed description considered in connection with the accompanying drawings. It is to be understood, however, that the drawings are designed as an illustration only and not as a definition of the limits of the invention.

In the drawings, wherein similar reference characters denote similar elements throughout the several views.

DETAILED DESCRIPTION OF THE PREFERRED EMBODIMENT

Figure 1:
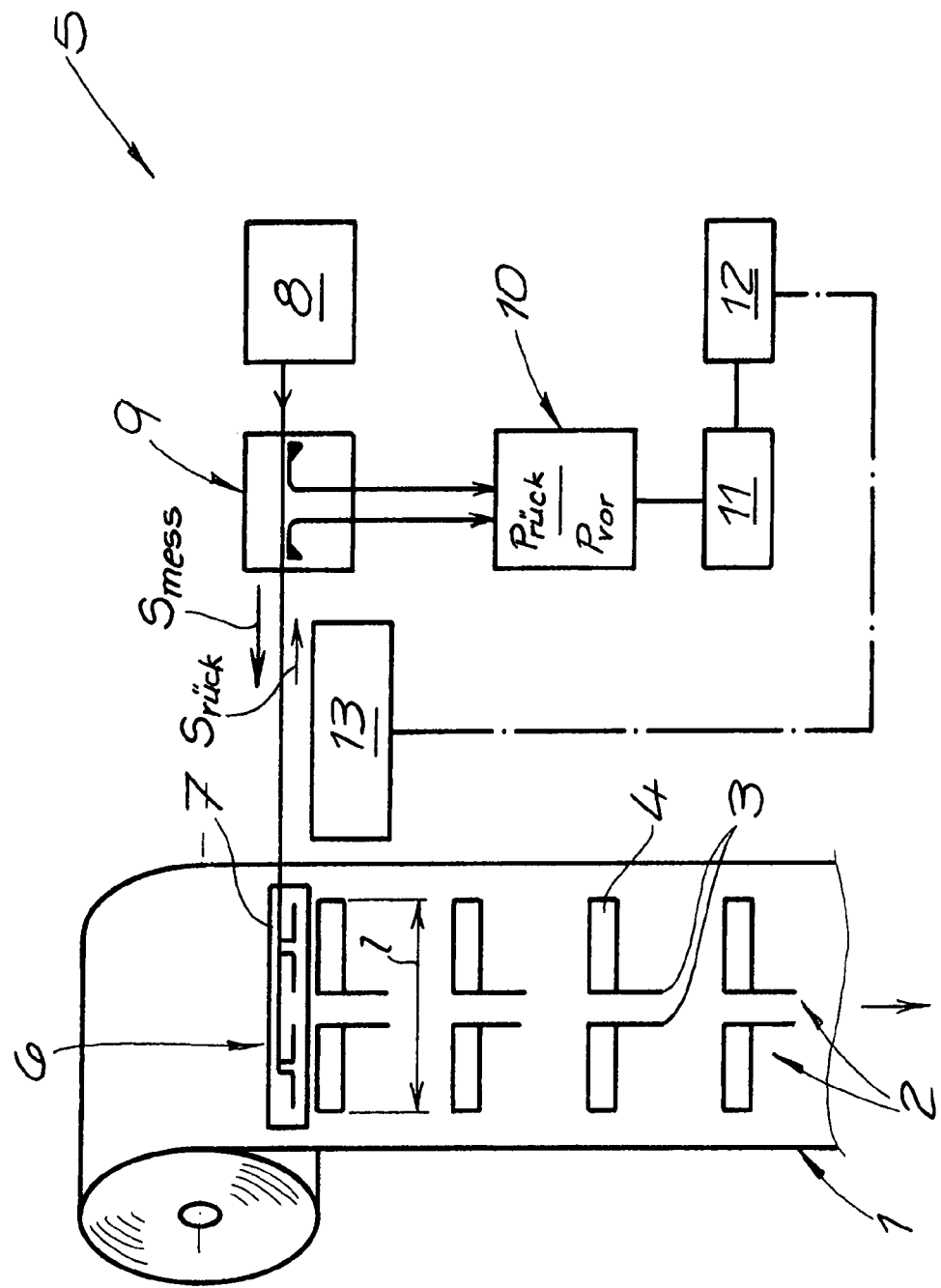
FIG. 1 shows a measurement system for contact-free testing of antennas applied to a material web.

Referring now in detail to the drawings and, in particular, FIG. 1 shows a material web 1 having antennas 2 for RFID labels applied to it. Antennas 2 are imprinted onto material web 1, which is configured as a polymer film, as half-wave dipole antennas, using a conductive ink and an intaglio printing process. Antennas 2 have two central connector ends 3, from which a rectangular conductive track 4 extends, in each instance. The working frequency $f_A$, which can lie at 900 MHZ, for example, is pre-determined by the total length l of antennas 2, which corresponds to about half the wavelength. Material web 1 with a plurality of antennas 2 is passed to a measurement device 5, and antennas 2 each are passed past an assigned measurement antenna arrangement 6 of measurement device 5 in the region of measurement device 5. In this connection, measurement antenna arrangement 6 has a separate measurement antenna 7 for each of conductive tracks 4. Measurement antennas 7 have a high-frequency signal $S_{mess}$ applied to them by a transmitter 8, by way of a directional coupler 9; the frequency $f_{mess}$ of this signal approximately corresponds to twice the frequency of the pre-determined working frequency $f_A$ of antenna 2. Directional coupler 9 emits a first and a second measurement signal, whereby the first measurement signal is proportional to the high-frequency power $P_{vor}$, which runs to measurement antenna arrangement 6, and whereby the second measurement signal is proportional to the high-frequency power $P_{rück}$, which is reflected by the measurement antenna arrangement. The front-to-back ratio is determined from the measurement signals, as a quotient of these two variables, in an analog divider 10. The value determined for the front-to-back ratio is subsequently applied to an operation amplifier 11 with threshold value setting. Depending on whether or not the threshold value was reached, an evaluation logic 12 determines whether or not individual antennas 2 each reach pre-determined production tolerances. For this purpose, at least 50 and preferably at least 100 measurement values are determined by evaluation logic 12 for each of antennas 2, and subsequently averaged. Antennas 2 that are recognized as being defective are marked with an imprint by a printing device 13. However, the position of the defective antennas 2 may also be electronically stored in the memory of a process control, and subsequently only the antennas 2 that are capable of functioning with an RFID chip are provided. Or, the defective antennas 2 may be marked by means of punching, or removed from the material web 1. The method according to the invention, for contact-free testing of antennas 2, allows high web speeds of more than 0.8 m/s and preferably more than 1.6 m/s.

Figure 2:
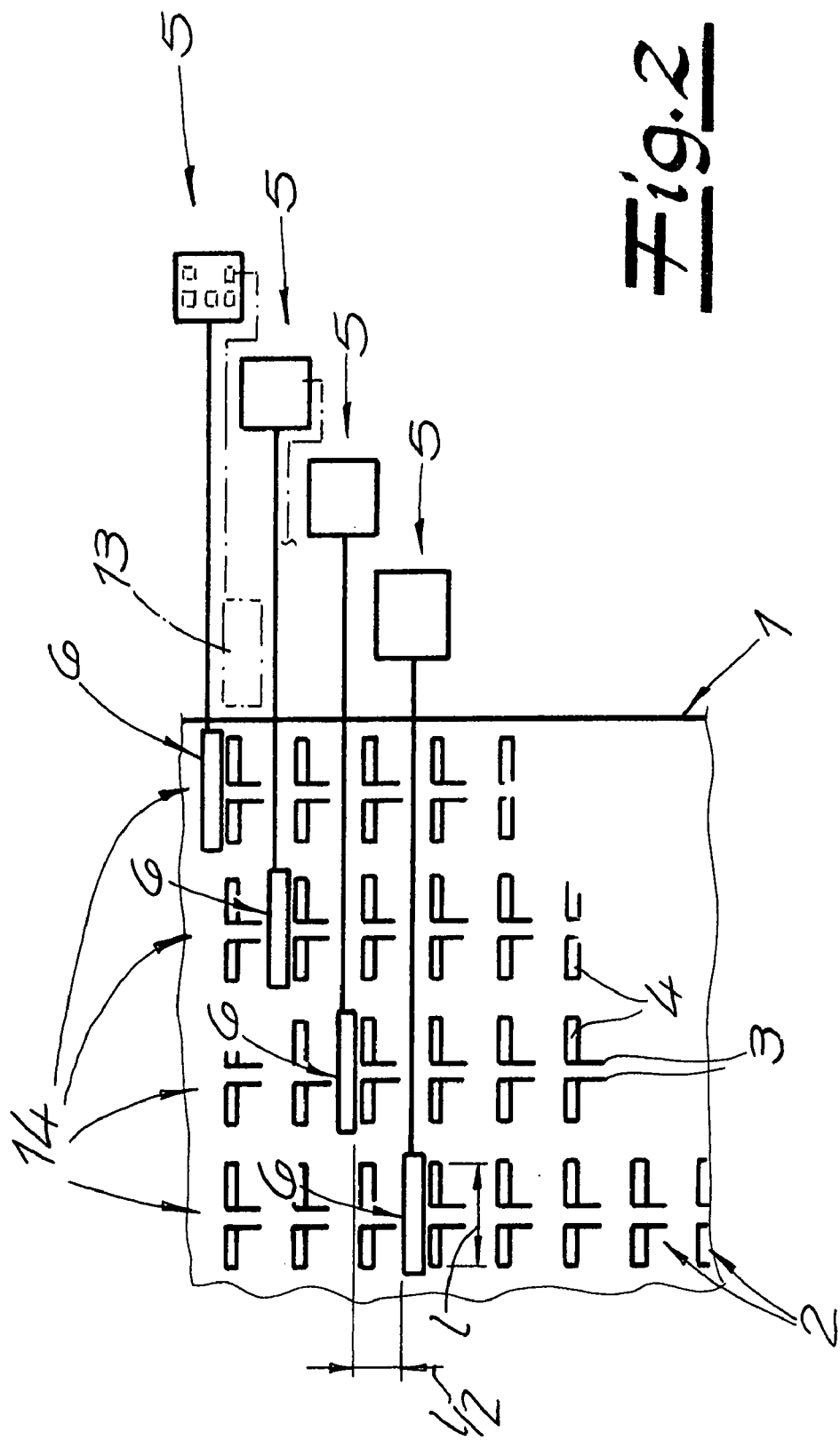
FIG. 2 shows an alternative embodiment of the measurement system for contact-free testing of antennas.

As shown in FIG. 2, it is possible, particularly in the case of mass production, to provide several rows 14 of antennas 2 in the crosswise direction of material web 1, and a separate measurement antenna arrangement 6 is provided for each of rows 14. In this connection, adjacent measurement antenna arrangements 6 are disposed offset by at least half a wavelength ($>>\frac{1}{2}$) of antennas 2 in the running direction of material web 1, in order to prevent reciprocal interference of measurement antenna arrangements 6 with regard to one another. As shown in FIG. 1, each measurement antenna arrangement 6 has a transmitter 8, a directional coupler 9, and the related amplifier/evaluation circuit assigned to it.

Figure 3:
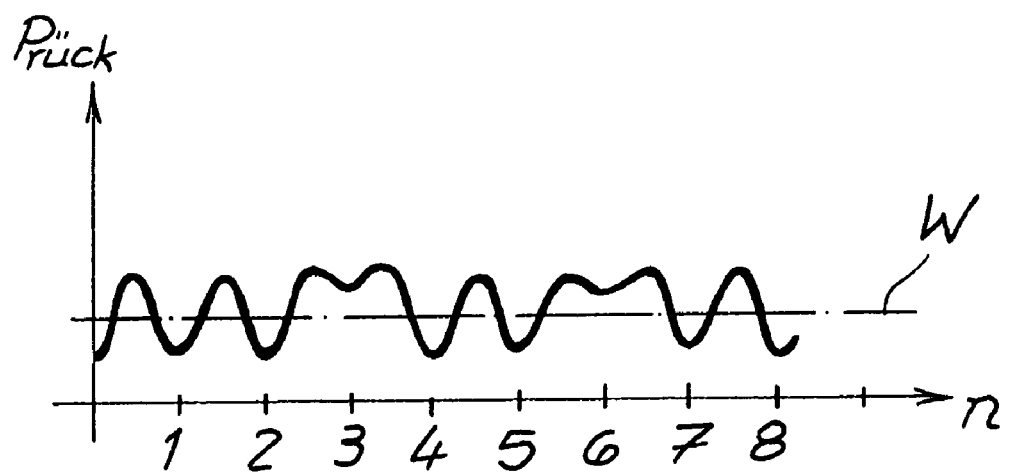
FIG. 3 shows the progression of the high-frequency power $P_{rück}$ reflected by the measurement arrangement.

FIG. 3 shows the time progression of high-frequency power $P_{rück}$ reflected by measurement antenna arrangement 6, as an example. When a first antenna 2 approaches, it absorbs part of the power made available to measurement antenna arrangement 6, thereby reducing the proportion of the returning power $P_{rück}$. In the case of resonance between antenna 2 and the frequency offered by measurement antenna arrangement 6, the amount of the reflected power $P_{rück}$ drops to a minimum. If antenna 2 has a defect, for example an interruption caused by a scratch, its effective length is changed and therefore the resonance frequency is also shifted, and therefore only a small proportion of the high-frequency power made available by measurement antenna arrangement 6 is absorbed. The amount of the reflected high-frequency power $P_{rück}$ therefore remains comparatively high. Accordingly, it is possible to differentiate between antennas 2 that are capable of functioning and those that are defective by means of setting a suitable threshold value W. In place of the continuous recording of a signal, as it is illustrated in FIG. 3, preferably a plurality of individual measurement values is recorded over a pre-determined time window for each of antennas 2, within the framework of the invention, and subsequently averaged. The averaged values are then compared with a default value. Depending on whether or not the pre-determined value is exceeded, adherence to the pre-determined production tolerances is then determined for each antenna 2.

Accordingly, while only a few embodiments of the present invention have been shown and described, it is obvious that many changes and modifications may be made thereunto without departing from the spirit and scope of the invention.

What is claimed is:

1. A method for contact-free testing of antennas for RFID chips, said antennas being formed as dipole antennas, with two conductive tracks, each track having one connector end and said antennas being applied to a material web with all of said connector ends being non contacted, wherein said two conductive tracks of each antenna have approximately the same length and, proceeding from central connector ends, extend away from one another, the method comprising the following steps:

passing the material web to a measurement device so that the antennas each are passed past an assigned measurement antenna arrangement of the measurement device, wherein a separate measurement antenna of the measurement antenna arrangement is provided for each of the conductive tracks;

applying a high-frequency signal $S_{mess}$ of a transmitter to the measurement antenna arrangement, wherein a frequency $f_{mess}$ of said high frequency signal $S_{mess}$ approximately corresponds to twice a working frequency $f_A$ of the antennas;

determining a high-frequency signal $S_{rück}$ that returns from the measurement antenna arrangement;

comparing said high-frequency signal with default values; and determining adherence to production tolerances for each antenna by means of said step of comparing.

2. A method according to claim 1, wherein the high-frequency signal $S_{mess}$ is passed from the transmitter to the measurement antenna arrangement by way of a directional coupler that emits a first measurement signal that is proportional to high-frequency power $P_{vor}$ which runs to the measurement antenna arrangement, and wherein the directional coupler emits a second measurement signal that is proportional to high-frequency power $P_{rück}$ which is reflected by the measurement antenna arrangement.

3. A method according to claim 1, wherein the material web is passed past the measurement device at an average web speed of more than 0.8 m/s.

4. A method according to claim 1, wherein at least 50 measurement values of the returning high-frequency signal $S_{rück}$ are determined for each of the antennas, and subsequently averaged.

5. A method according to claim 1, wherein the antennas that do not meet the production tolerances are marked or removed.

6. A method according to claim 1, wherein the measurement antenna arrangement has a high-frequency signal $S_{mess}$ in a UHF band applied to it by the transmitter.

* * * * *